United States Patent
Fujimoto et al.

(10) Patent No.: US 6,830,973 B2
(45) Date of Patent: Dec. 14, 2004

(54) NONVOLATILE SEMICONDUCTOR MEMORY DEVICE AND METHOD OF MANUFACTURING THE SAME

(75) Inventors: Hiromasa Fujimoto, Kyoto (JP); Fumihiko Noro, Kyoto (JP); Masataka Kusumi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 107 days.

(21) Appl. No.: 10/238,636

(22) Filed: Sep. 11, 2002

(65) Prior Publication Data

US 2003/0047775 A1 Mar. 13, 2003

(30) Foreign Application Priority Data

Sep. 11, 2001  (JP) .......................................... 2001-274471

(51) Int. Cl.$^7$ .......................................... H01L 21/8247
(52) U.S. Cl. .......................... 438/257; 438/266; 438/773
(58) Field of Search .......................... 438/773, 257–267

(56) References Cited

U.S. PATENT DOCUMENTS

| | | |
|---|---|---|
| 4,698,787 A | 10/1987 | Mukherjee et al. |
| 5,661,056 A | 8/1997 | Takeuchi |
| 5,715,196 A | 2/1998 | Odake et al. |
| 6,136,652 A * | 10/2000 | Hazani .................... 438/260 |
| 6,272,050 B1 | 8/2001 | Cunningham et al. |

FOREIGN PATENT DOCUMENTS

| | | |
|---|---|---|
| EP | 0 854 514 A1 | 7/1996 |
| JP | 61-127179 A | 6/1986 |

OTHER PUBLICATIONS

M. Bidaud et al. "*High Reliable In Situ Steam Generation Process for 1.5–2.5nm Gate Oxide*", 197$^{th}$ ECS Conf. vol. 2000–1, Abs., No. 540.

Teresa Trowbridge et al., "*Enhanced Oxidation of Silicon Nitride using In Situ Steam Generation*", 199$^{th}$ ECS Conf. vol. 2000–1, Abs., No. 269.

Kianian et al., "A Novel 3 Volts–Only, Small Sector Erase, High Density Flash E2Prom", pp. 71–72, 1994, Symposium on VLSI Technology Digest of Technical Papers.

Kuppurao S. et al., "In Situ Steam Generation: A New Rapid Oxidation Technique" Solid State Technology, Cowan Publ. Corp. Washington, US, vol. 43, No. 7, Jul. 2000, pp. 233–234, 236, 239.

* cited by examiner

*Primary Examiner*—Richard A. Booth
(74) *Attorney, Agent, or Firm*—McDermott Will & Emery LLP

(57) ABSTRACT

Using a rapid thermal oxidation device, the top and side surfaces of a floating gate electrode are oxidized by In Situ Steam Generation (ISSG), wherein oxygen to which about 0.5 to 33% hydrogen has been added is introduced directly into a chamber with a temperature of approximately 900 to 1100° C. and a pressure of approximately 1,000 to 2,000 Pa, in order to generate water vapor from the introduced hydrogen and oxygen on a heated semiconductor substrate. Thus, an insulating film made of silicon oxide is formed on the surface of the floating gate electrode.

4 Claims, 13 Drawing Sheets

NONVOLATILE SEMICONDUCTOR MEMORY DEVICE AND METHOD OF MANUFACTURING THE SAME

BACKGROUND OF THE INVENTION

The present invention relates to nonvolatile semiconductor memory devices provided with a floating gate capable of electric write and erase operations, and a method of manufacturing the same.

Conventionally, floating gate type nonvolatile semiconductor memory devices such as that disclosed in JP S61-127179A, which has a so-called stacked-gate structure made of a floating gate electrode and a control gate electrode stacked thereon, are well known as semiconductor memory devices capable of electric write and erase operations.

As shown in FIG. 14, a conventional nonvolatile semiconductor memory device with a stacked-gate structure is made of a semiconductor substrate 101 having a source region 102 and a drain region 103 formed in its upper portion by ion implantation, and a stacked-gate structure 110 formed on the semiconductor substrate 101 at the region between the source region 102 and the drain region 103, that is, on the channel region. The stacked-gate structure 110 includes a tunnel insulating film 104, a floating gate electrode 105, a capacitor insulating film 106, and a control gate electrode 107 formed sequentially from the substrate side.

In such a conventional stacked-gate nonvolatile semiconductor memory device, data are read by providing a potential difference of about 1.5 V between the source region 102 and the drain region 103 and applying a voltage of about 5 V to the control gate electrode 107, and then detecting the value of the current flowing between the source region 102 and the drain region 103.

Data are erased by applying 0 V to the control gate electrode 107 and a voltage of about 10 to 15 V to the drain region 103, and then, due to Fowler Nordheim Tunneling, the electrons that have accumulated in the floating gate electrode 105 are pulled to the drain region 103 through the tunnel insulating film 104 via the area of overlap between the floating gate electrode 105 and the drain region 103.

Conventional stacked-gate nonvolatile semiconductor memory devices, however, are prone to the problem of over-erasing, where electrons are excessively pulled from the floating gate electrode 105 during erasing and as a consequence the channel region goes into depletion mode. As a result, current also flows through non-selected memory cells during readout, and this results in read mistakes.

To remedy these read mistakes, floating gate nonvolatile semiconductor memory devices with a so-called split-gate structure in which a portion of the control gate electrode is in opposition to the channel region have recently been proposed in, for example, S. Kianian, et al., VLSI Technologies Dig. pp. 71–72, 1994, among others.

As shown in FIG. 15, a conventional nonvolatile semiconductor memory device with a split-gate structure is made of a semiconductor substrate 101 having a source region 102 and a drain region 103 formed in its upper portion by ion implantation, and a split-gate structure 111 formed on the channel region of the semiconductor substrate 101 between the source region 102 and the drain region 103.

The split-gate structure 111 includes a floating gate electrode 105, which is formed such that one of its sides overlaps with the source region 102 with a tunnel insulating film 104 between them, a capacitor insulating film 106 that covers the floating gate electrode 105 and the semiconductor substrate 101, and a control gate electrode 107 that covers an end portion of the drain region 103 and the top surface and the side surface on the drain region 103 side of the floating gate electrode 105 and is capacitively coupled with the floating gate electrode 105.

Because the semiconductor memory device has the split-gate structure 111, even if the floating gate electrode 105 is over-erased, current does not flow through non-selected memory cells during readout and thus read mistakes do not occur, because the channel region is also formed below the control gate electrode 107.

However, in conventional stacked-gate and split-gate nonvolatile semiconductor memory devices, the capacitor insulating film 106 that is capacitively coupled with the control gate electrode 107 is often formed by thermal oxidation after the floating gate electrode 105 is formed, at which time film thickening referred to as a "birds beak" occurs in the side portion of the tunnel insulating film 104 in the gate length direction. As a consequence of the birds beak, the read current value during reading is reduced and the electric field applied to the tunnel insulating film 104 during erasing is weakened, thus leading to a noticeable drop in the erase speed.

Moreover, the capacitor insulating film 106, which is made by oxidizing the polysilicon formed on the floating gate electrode 105, is formed roughly twice as thick as a silicon oxide film at an identical oxidation time and has a lower withstand voltage. The resulting drop in the value of the capacitive coupling ratio between the control gate electrode 107 and the floating gate electrode 105 leads to a deterioration in reliability.

It should be noted that the capacitive coupling ratio is the ratio of the static capacitance between the floating gate electrode 105 and the control gate electrode 107 to the total static capacitance. The total static capacitance is the sum of the static capacitance between the floating gate electrode 105 and the control gate electrode 107 and the static capacitance between the floating gate electrode 105 and the semiconductor substrate 101 (the channel region, the source region 102 and the drain region 103).

SUMMARY OF THE INVENTION

The present invention solves the aforementioned conventional problems, and it is an object thereof to prevent the generation of a birds beak in the tunnel insulating film and to improve the film quality of and obtain a predetermined film thickness for the capacitor insulating film in the nonvolatile semiconductor memory device.

To achieve the above object, the present invention employs In Situ Steam Generation to form the capacitor insulating film.

More specifically, a nonvolatile semiconductor memory device according to the present invention is provided with a floating gate electrode that is formed on a semiconductor substrate with a first insulating film interposed between them and that is in an electrically floating state, and a control gate electrode that is formed on the floating gate electrode with a second insulating film interposed between them and that supplies a predetermined electric potential to the semiconductor substrate and the floating gate electrode, wherein the first insulating film has a substantially uniform thickness at the portion where it is in opposition to the floating gate electrode.

According to the nonvolatile semiconductor memory device of the present invention, the first insulating film, which functions as the tunnel film, has a substantially uniform film thickness at the portion where it is in opposition to the floating gate electrode, and there are no birds beak-shaped film thickening at the end portions of the first insulating film in the gate length direction. Thus, there are no reductions in the value of the read current or drops in the erase speed.

In the nonvolatile semiconductor memory device of the present invention, it is preferable that the control gate electrode is formed from a top surface of the floating gate electrode, along a side surface thereof, to the semiconductor substrate next to that side surface, and that the control gate electrode is formed with the second insulating film interposed between it and the side surface and with a third insulating film interposed between it and the top of the semiconductor substrate. Consequently, a split-gate structure can be adopted for the gate.

In the nonvolatile semiconductor memory device of the present invention, it is preferable that the first insulating film and the third insulating film are formed through identical processes.

In the nonvolatile semiconductor memory device of the present invention, it is preferable that the second insulating film and the third insulating film are formed through identical processes.

A method of manufacturing a nonvolatile semiconductor memory device according to the present invention includes a first step of forming a floating gate electrode from a first conducting film by patterning the first conducting film after a first insulating film and the first conducting film are formed on a semiconductor substrate, a second step of forming a second insulating film on an upper portion and a side portion of the floating gate electrode by introducing hydrogen and oxygen above the heated semiconductor substrate and generating water vapor on the semiconductor substrate from the introduced hydrogen and oxygen, and a third step of forming a control gate electrode made of a second conducting film on the floating gate electrode with the second insulating film interposed between them.

According to the method of manufacturing a nonvolatile semiconductor memory device of the present invention, by using a so-called In Situ Steam Generation technique, in which water vapor is generated on the semiconductor substrate from the hydrogen and oxygen that are introduced onto the heated substrate after the first insulating film is formed on the semiconductor substrate, the second insulating film is formed on the upper portion and the side portions of the floating gate electrode. In Situ Steam Generation does not cause a birds beak in the already formed first insulating film (the tunnel film), and thus the film thickness of the first insulating film is substantially uniform. As a result, there are no reductions in the value of the read current or drops in the erase speed. Moreover, the second insulating film, which acts as the capacitor insulating film, is formed through In Situ Steam Generation, and thus, even if the second insulating film is a silicon oxide film of oxidized polysilicon, it can be obtained at a predetermined film thickness and at a precise film quality, so that there are no drops in the capacitive coupling ratio.

In the method of manufacturing a nonvolatile semiconductor memory device of the present invention, it is preferable that the first step includes a step of removing the first insulating film with the floating gate electrode serving as a mask, and that in the second step, the second insulating film is also formed on an upper portion of the semiconductor substrate.

In the method of manufacturing a nonvolatile semiconductor memory device of the present invention, it is preferable that the third step includes a step of depositing the second conducting film over the entire surface of the semiconductor substrate, including the floating gate electrode, and a step of patterning the deposited second conducting film such that the control gate electrode is positioned above only the floating gate electrode. Thus, a stacked-gate type gate structure can be achieved.

In the method of manufacturing a nonvolatile semiconductor memory device of the present invention, it is preferable that the third step includes a step of depositing the second conducting film over the entire surface of the semiconductor substrate, including the floating gate electrode, and a step of patterning the deposited second conducting film such that the control gate electrode covers a top surface and a side surface of the floating gate electrode. Thus, a split-gate type gate structure can be achieved.

DETAILED DESCRIPTION OF THE INVENTION

Embodiment 1

A first embodiment of the present invention is described with reference to the drawings.

Figure 1:
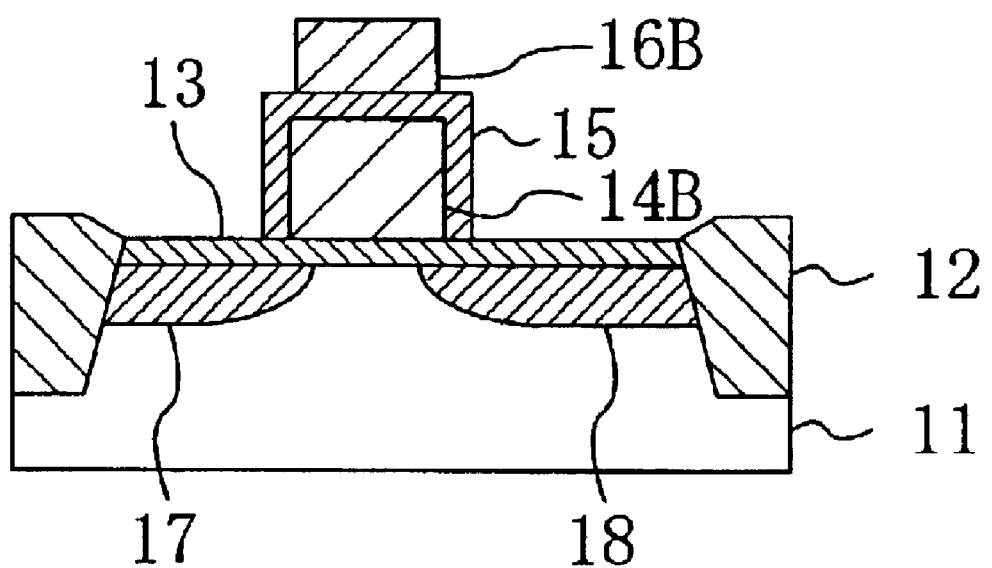
FIG. 1 is diagram showing the structural cross section of a stacked-gate type nonvolatile semiconductor memory device according to Embodiment 1 of the present invention.

FIG. 1 shows a cross section of the structure of a nonvolatile semiconductor memory device having a stacked-gate type gate structure according to the present invention.

As shown in FIG. 1, for example, an isolation region 12 made of silicon oxide or the like and an element formation region surrounded by the isolation region 12 are selectively formed in the upper portion of a p-type silicon semiconductor substrate 11. A first insulating film 13 approximately 8 to 11 nm thick, a floating gate electrode 14B made of n-type polysilicon, and a second insulating film 15 approximately 8 to 20 nm thick that covers the top surface and side surfaces of the floating gate electrode 14B are formed on the element formation region of the semiconductor substrate 11, and a control gate electrode 16B made of n-type polysilicon is formed above the floating gate electrode 14B with the second insulating film 15 interposed between them. Also, an n-type source region 17 and an n-type drain region 18 are respectively formed in the semiconductor substrate 11 in the regions at the sides of the floating gate electrode 14B.

In Embodiment 1, the gate has a stacked-gate structure in which the portion of the first insulating film 13 where the floating gate electrode 14B and the semiconductor substrate 11 oppose one another functions as a tunnel film. The first insulating film 13 has been formed at a substantially uniform film thickness without birds beak-shaped film thickening at its side end portions in the gate length direction.

It should be noted that the portion in the second insulating film 15 where the floating gate electrode 14B and the control gate electrode 16B oppose one another functions as a capacitor film.

Hereinafter, a method of manufacturing the nonvolatile semiconductor memory device configured as above is described with reference to the drawings.

FIGS. 2A to 2D and FIGS. 3A to 3D show cross-sectional views of the steps and the order of the method of manufacturing the nonvolatile semiconductor memory device according to Embodiment 1 of this invention.

Figure 2A:
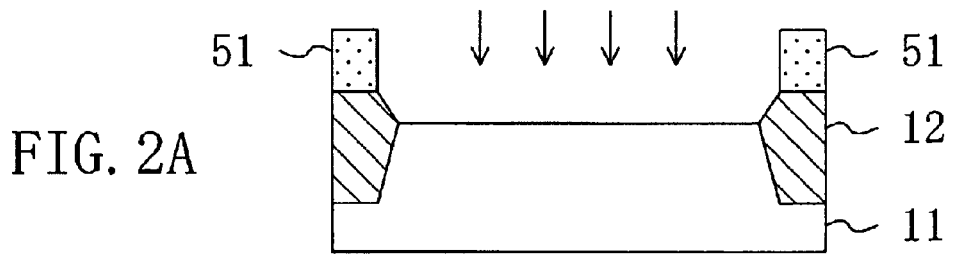
FIGS. 2A to 2D are structural cross-sectional diagrams showing the steps and the order of the method of manufacturing the stacked-gate type nonvolatile semiconductor memory device according to Embodiment 1 of this invention.

First, as shown in FIG. 2A, the isolation region 12 made of silicon oxide is selectively formed in an upper portion of the p-type silicon semiconductor substrate 11, and then, with a first resist pattern 51 that has an opening at the element formation region serving as a mask, p-type impurity ions are implanted into the semiconductor substrate 11 to form a p-type well region and a p-type channel region.

Figure 2B:
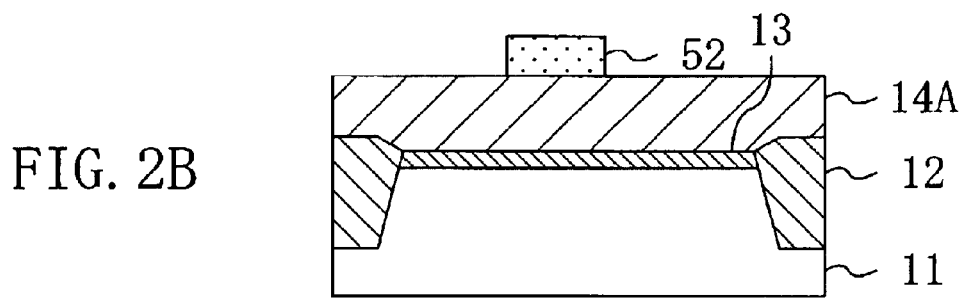

Next, as shown in FIG. 2B, after the first resist pattern 51 has been removed, the first insulating film 13 made of silicon oxide is formed on the element formation region of the semiconductor substrate 11 at a film thickness of approximately 8 to 11 nm through thermal oxidation, for example. A first polysilicon film 14A is then deposited by CVD. Here, the first polysilicon film 14A can be provided with conductivity by adding phosphorus (P) during deposition or can be provided with conductivity by implanting phosphorus ions after deposition. Then, using photolithography, a second resist pattern 52 having a floating gate pattern is formed on the first polysilicon film 14A.

Figure 2C:
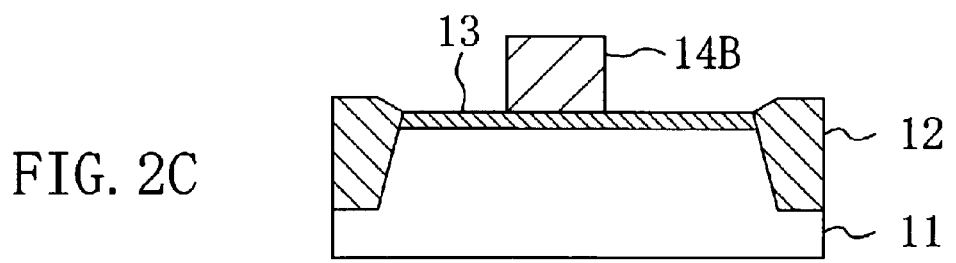

Next, as shown in FIG. 2C, the second resist pattern 52 serves as a mask and the first polysilicon film 14A is etched to form the floating gate electrode 14B from the first polysilicon film 14A. Here, the portion in the first insulating film 13 where the floating gate electrode 14B and the semiconductor substrate 11 oppose one another (channel region) functions as a tunnel film. The second resist pattern 52 is then removed.

Figure 2D:
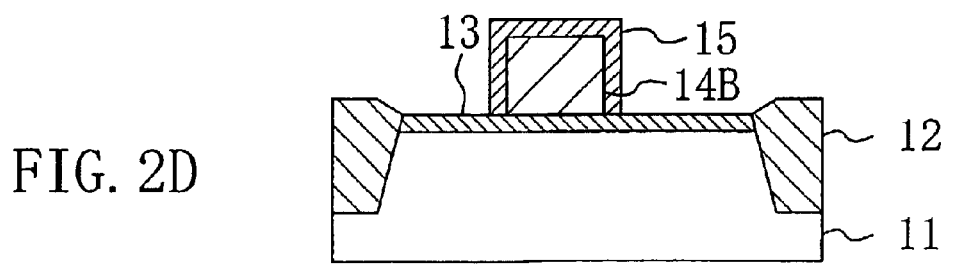

Then, as shown in FIG. 2D, using a rapid thermal oxidation device, the top and side surfaces of the floating gate electrode 14B are oxidized by pyrogenic oxidation through internal combustion, in which oxygen to which about 0.5 to 33% hydrogen has been added is introduced directly into a chamber having a temperature of approximately 900 to 1100° C. and a pressure of approximately 1,000 to 2,000 Pa, in order to generate water vapor from the introduced hydrogen and oxygen onto the heated semiconductor substrate 11, thus forming the second insulating film 15 made of silicon oxide on the surface of the floating gate electrode 14B. Pyrogenic oxidation through internal combustion has been reported in "M. Bidaud et al., 197th ECS Conf. Volume 2000-1, Abs. No. 540" and "T. Trowbridge et al., 199th ECS Conf. Volume 2001-1, Abs. No. 269", among others, in which it is referred to as In Situ Steam Generation (ISSG).

Figure 3A:
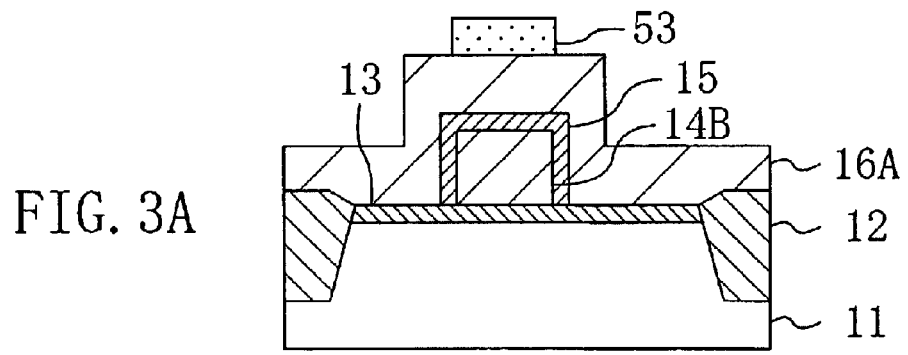
FIGS. 3A to 3D are structural cross-sectional diagrams showing the steps and the order of the method of manufacturing the stacked-gate type nonvolatile semiconductor memory device according to Embodiment 1 of this invention.

Next, as shown in FIG. 3A, using CVD, a second polysilicon film 16A is deposited over the entire surface of the first insulating film 13, including the second insulating film 15. It should be noted that the second polysilicon film 16A can be provided with conductivity by adding phosphorus during deposition or can be provided with conductivity by implanting phosphorus ions after deposition. Then, using photolithography, a third resist pattern 53 that has a control gate pattern is formed on the second polysilicon film 16A.

Figure 3B:
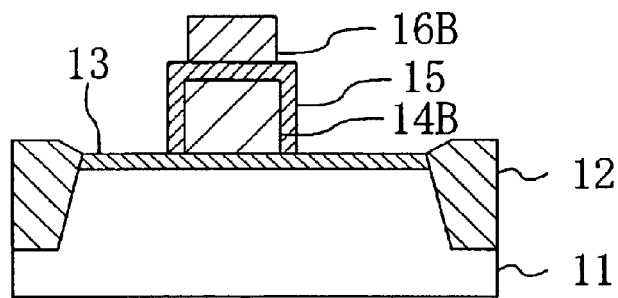

Next, as shown in FIG. 3B, the third resist pattern 53 serves as a mask and the second polysilicon film 16A is etched to form the control gate electrode 16B from the second polysilicon film 16A onto the floating gate electrode 14B with the second insulating film 15 interposed between them. Here, the portion of the second insulating film 15 where the floating gate electrode 14B and the control gate electrode 16B oppose one another functions as a capacitor film. The third resist pattern 53 is then removed.

Figure 3C:
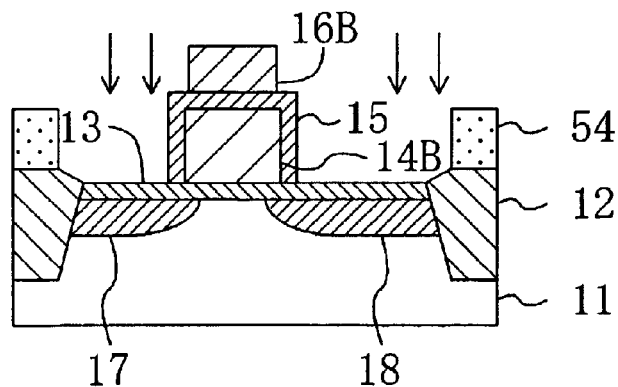

Next, as shown in FIG. 3C, with a fourth resist pattern 54, which has an opening at the element formation region, the control gate electrode 16B and the floating gate electrode 14B serving as masks, phosphorus or arsenic (As) ions are implanted in the semiconductor substrate 11 to form the source region 17 and the drain region 18 in the element formation region.

Figure 3D:
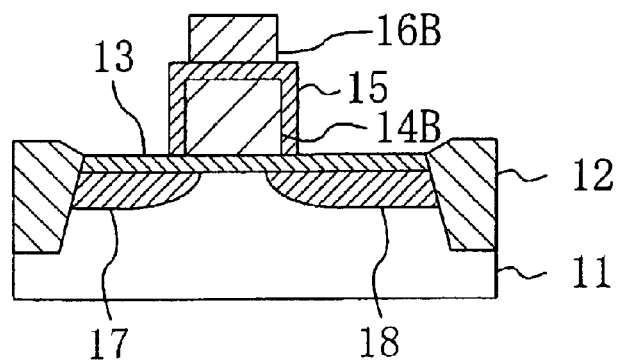

Then, as shown in FIG. 3D, the fourth resist pattern 54 is removed to obtain the nonvolatile semiconductor memory device shown in FIG. 1.

Figure 14:
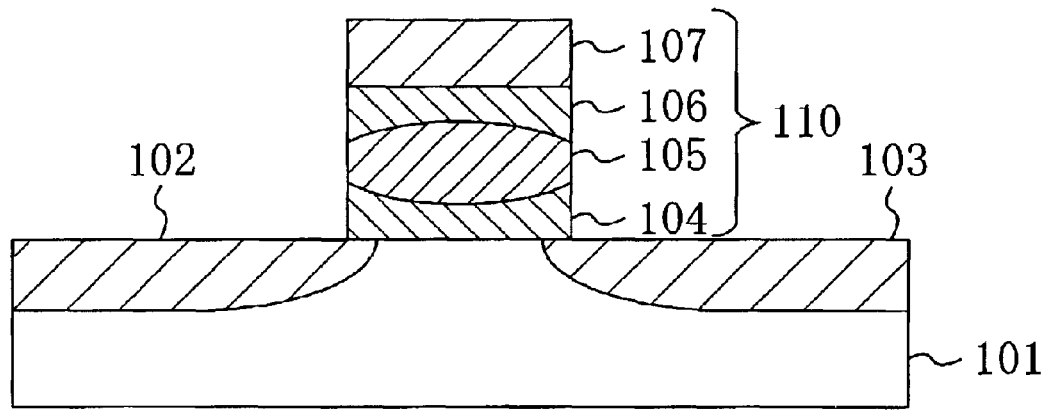
FIG. 14 is a diagram showing the structural cross section of a conventional stacked-gate type nonvolatile semiconductor memory device.

Thus, according to the method of manufacturing the nonvolatile semiconductor memory device according to Embodiment 1, the second insulating film 15 is formed on the surface of the floating gate electrode 14B through In Situ Steam Generation (ISSG), in which water vapor is generated on the semiconductor substrate 11 from the hydrogen and the oxygen that are introduced into the chamber. Consequently, the portion of the first insulating film 13 that is below the floating gate electrode 14B in this embodiment is almost entirely without a birds beak like that shown in FIG. 14, which is generated when the insulating film is formed through an ordinary oxidization method, such as a dry oxidation method in which oxygen gas that does not include water vapor is introduced into the chamber or a wet oxidation method in which externally created water vapor is introduced into the chamber. Therefore, the first insulating film 13 has a substantially uniform film thickness.

As a result, the deterioration of the element's properties as a transistor can be inhibited, that is, the drop in erase speeds due to a thick first insulating film 13 (tunnel film) can be prevented.

Figure 4:
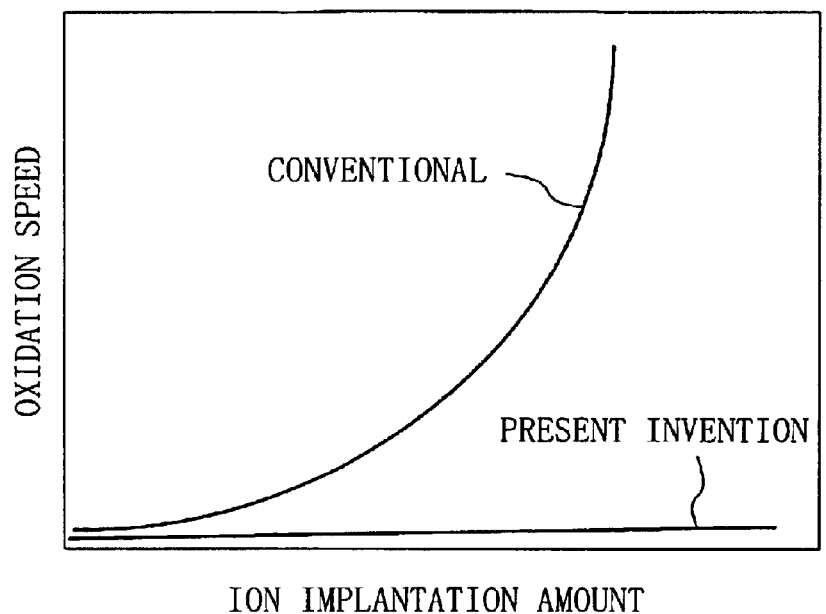
FIG. 4 is a graph illustrating the relationship between the amount of impurity ions that are implanted into the polysilicon film and the speed of oxidation, with regard to an ordinary method of oxidation and the In Situ Steam Generation method employed in the method of manufacturing the stacked-gate type nonvolatile semiconductor memory device according to Embodiment 1 of this invention.
Figure 5:
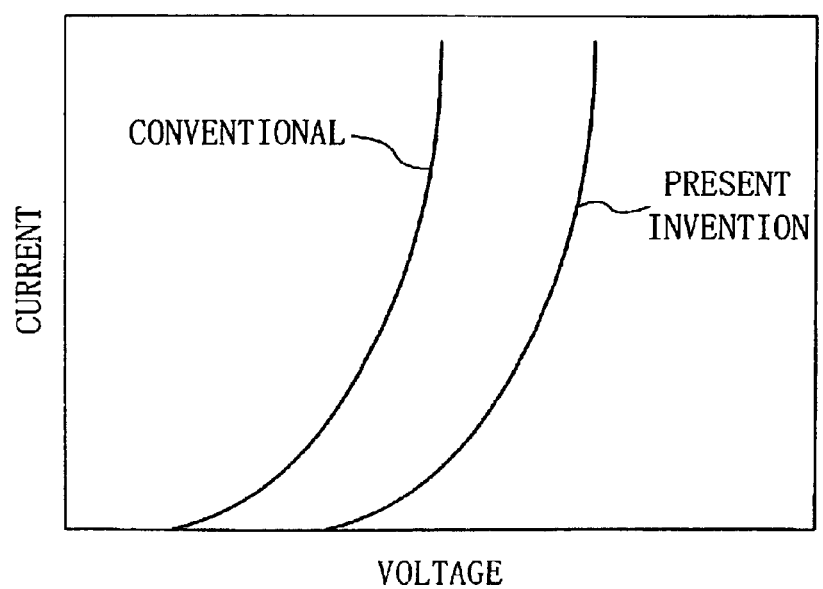
FIG. 5 is a graph illustrating withstand voltage of the polysilicon oxide film created through the In Situ Steam Generation method employed in the method of manufacturing the stacked-gate type nonvolatile semiconductor memory device according to Embodiment 1 of this invention and the withstand voltage of the polysilicon oxide film created through an ordinary method of oxidation.

Moreover, with regard to the film thickness of the second insulating film 15 formed on the surface of the polysilicon floating gate electrode 14B through ISSG, the speed at which the film is oxidized is substantially constant independent from the amount of ion implantation to the polysilicon film, which is the underlining layer, as shown in FIG. 4. Therefore, the film thickness of the second insulating film 15 can be kept down to about 60 to 80% of the film thickness achieved through conventional oxidation methods, so that the second insulating film 15 can be obtained at a predetermined film thickness. Also, as shown in FIG. 5, the withstand voltage of the polysilicon oxide film formed through ISSG is also increased, and as a result the value of the capacitive coupling ratio between the floating gate electrode 14B and the control gate electrode 16B is increased, so that it is possible to achieve improved writing speeds and a larger read current.

It should be noted that in Embodiment 1, the control gate electrode 16B and the floating gate electrode 14B were patterned separately, however, there is no limitation to this, and this embodiment is obviously also applicable to other methods of manufacturing a nonvolatile memory device having a stacked-gate structure, such as a method in which both electrodes 14B and 16B are patterned simultaneously.

MODIFIED EXAMPLE OF EMBODIMENT 1

Hereinafter, a method of manufacturing the nonvolatile semiconductor memory device according to a modified example of Embodiment 1 of this invention is described with reference to the drawings.

FIGS. 6A to 6D and FIGS. 7A to 7D show cross-sectional views of the steps and the order of the method of manufacturing the nonvolatile semiconductor memory device according to the modified example of Embodiment 1 of this invention.

Figure 6A:
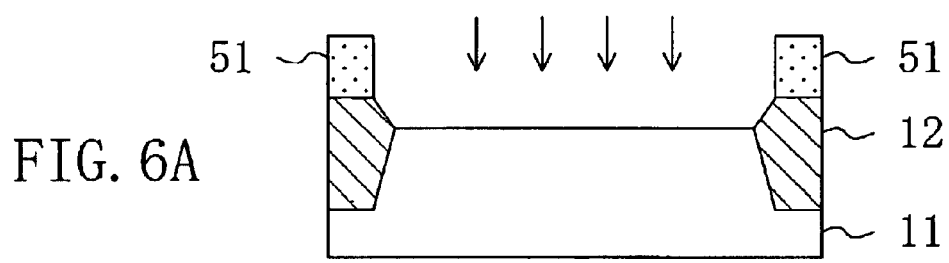
FIGS. 6A to 6D are structural cross-sectional diagrams showing the steps and the order of the method of manufacturing the stacked-gate type nonvolatile semiconductor memory device according to the modified example of Embodiment 1 of this invention.

First, as shown in FIG. 6A, the isolation regions 12 made of silicon oxide are selectively formed in the upper portion of the p-type silicon semiconductor substrate 11, and then, with a first resist pattern 51 that has an opening at the element formation region serving as a mask, p-type impurity ions are implanted into the semiconductor substrate 11 to form a p-type well region and a p-type channel region.

Figure 6B:
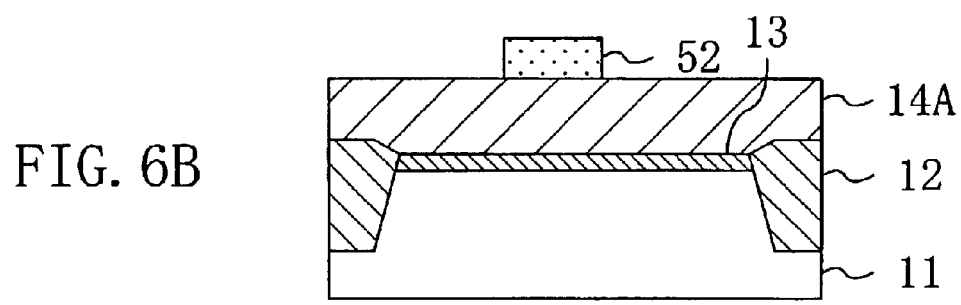

Next, as shown in FIG. 6B, after the first resist pattern 51 has been removed, the first insulating film 13 made of silicon oxide is formed on the element formation region of the semiconductor substrate 11 at a film thickness of approximately 8 to 11 nm through thermal oxidation. The first polysilicon film 14A is then deposited by CVD. Here, the first polysilicon film 14A can be provided with n-type conductivity during or after deposition. Then, using photolithography, a second resist pattern 52 having a floating gate pattern is formed on the first polysilicon film 14A.

Figure 6C:
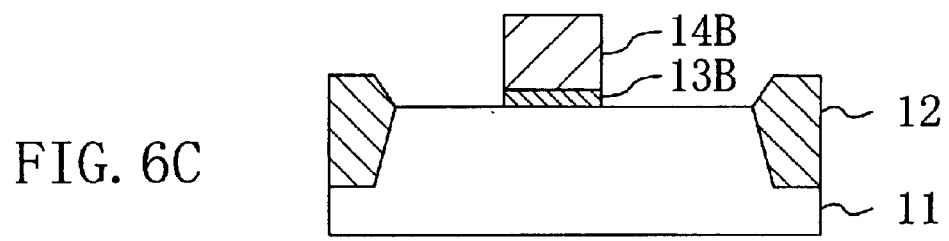

Then, as shown in FIG. 6C, the second resist pattern 52 serves as a mask and the first polysilicon film 14A and the first insulating film 13 are sequentially etched to form the floating gate electrode 14B from the first polysilicon film 14A and then form a tunnel insulating film 13B from the first insulating film 13. The second resist pattern 52 is then removed.

Figure 6D:
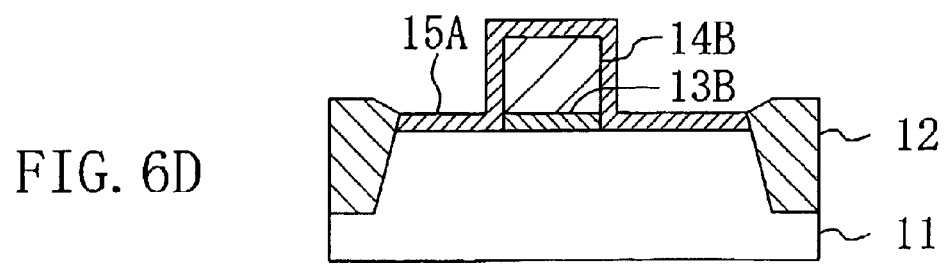

Then, as shown in FIG. 6D, using a rapid thermal oxidation device, a second insulating film 15A made of silicon oxide is formed on the element formation region of the semiconductor substrate 11 and on the top and side surfaces of the floating gate electrode 14B through ISSG, wherein oxygen to which about 0.5 to 33% hydrogen has been added is introduced directly into a chamber having a temperature of approximately 900 to 1100° C. and a pressure of approximately 1,000 to 2,000 Pa, in order to generate water vapor from the introduced hydrogen and oxygen onto the heated semiconductor substrate 11.

Figure 7A:
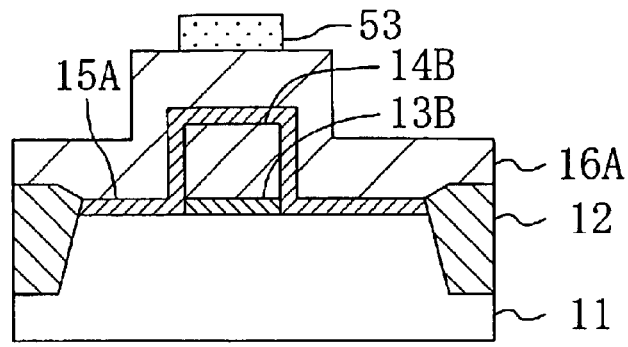
FIGS. 7A to 7D are structural cross-sectional diagrams showing the steps and the order of the method of manufacturing the stacked-gate type nonvolatile semiconductor memory device according to the modified example of Embodiment 1 of this invention.

Next, as shown in FIG. 7A, using CVD, the second polysilicon film 16A is deposited on the second insulating film 15A. It should be noted that the second polysilicon film 16A can be provided with conductivity by adding phosphorus during deposition or can be provided with conductivity by implanting phosphorus ions after deposition. Then, using photolithography, a third resist pattern 53 that has a control gate pattern is formed on the second polysilicon film 16A.

Figure 7B:
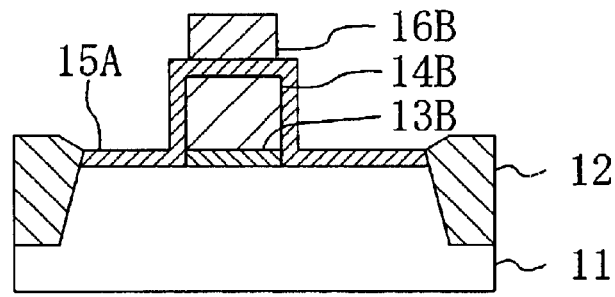

Next, as shown in FIG. 7B, the third resist pattern 53 serves as a mask and the second polysilicon film 16A is etched to form the control gate electrode 16B from the second polysilicon film 16A. Here, the portion of the second insulating film 15A where the floating gate electrode 14B and the control gate electrode 16B oppose one another functions as a capacitor film. The third resist pattern 53 is then removed.

Figure 7C:
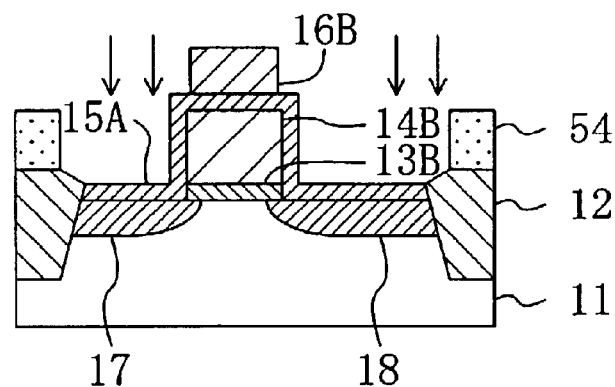

Next, as shown in FIG. 7C, with a fourth resist pattern 54, which has an opening at the element formation region, the control gate electrode 16B and the floating gate electrode 14B serving as masks, phosphorus or arsenic ions are implanted in the semiconductor substrate 11 to form the source region 17 and the drain region 18 in the element formation region.

Figure 7D:
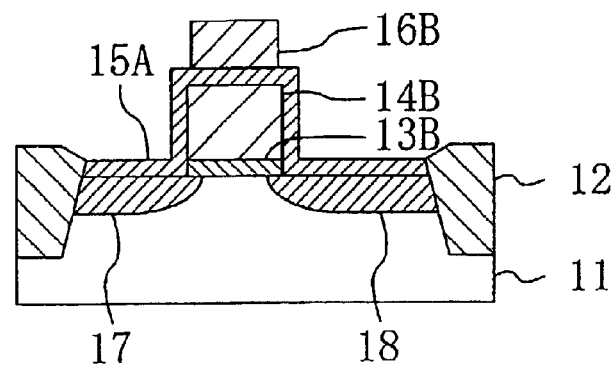

Then, as shown in FIG. 7D, the fourth resist pattern 54 is removed.

Accordingly, this modified example differs from Embodiment 1 in that the first insulating film 13 is patterned to the same shape as the floating gate electrode 14B.

Consequently, like in Embodiment 1, the second insulating film 15A is formed on the surface of the floating gate electrode 14B and on the semiconductor substrate 11 through ISSG, in which water vapor is generated on the semiconductor substrate 11 from the hydrogen and the oxygen that are introduced into the chamber, and thus almost no birds beak is generated at the side portions of the tunnel insulating film 13B.

Moreover, the film thickness of the second insulating film 15 formed by ISSG on the surface of the polysilicon floating gate electrode 14B can be reduced to about 60 to 80% of the film thickness obtained through conventional oxidation methods, so that the second insulating film 15 can be obtained at a predetermined film thickness.

Thus, the erase speed during the erase operation does not drop, and the value of the capacitive coupling ratio between the floating gate electrode 14B and the control gate electrode 16B is increased, so that low-voltage operation and high-speed operation are possible.

It should be noted that in this modified example as well, the control gate electrode 16B and the floating gate electrode 14B were patterned separately, however, there is no limitation to this, and this modified example can obviously also be applied to other methods of manufacturing a nonvolatile memory device having a stacked-gate structure, such as a method in which both electrodes 14B and 16B are patterned simultaneously.

Embodiment 2

Hereinafter, a second embodiment of the present invention is described with reference to the drawings.

Figure 8:
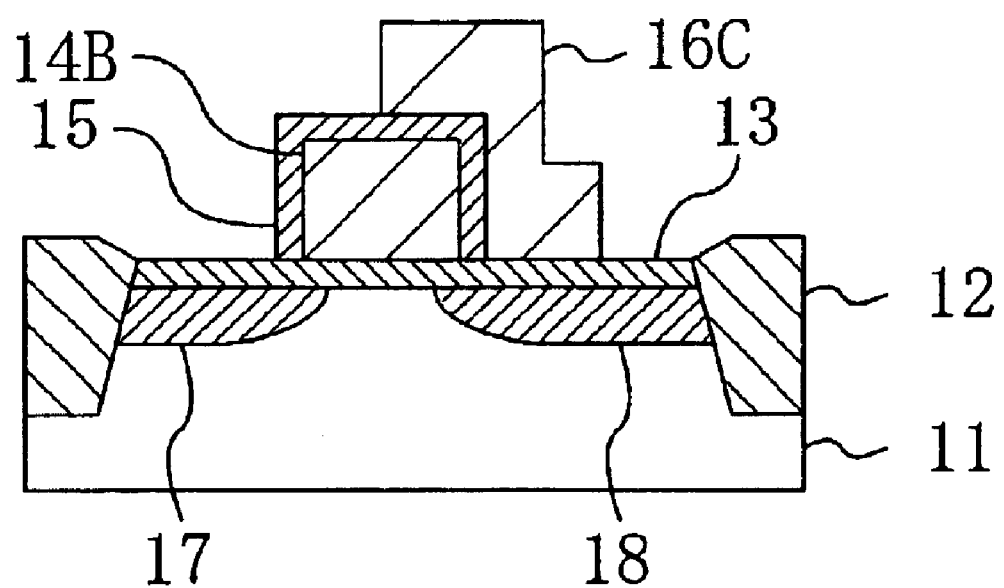
FIG. 8 is diagram showing the structural cross section of a split-gate type nonvolatile semiconductor memory device according to Embodiment 2 of the present invention.

FIG. 8 shows a cross section of the structure of a nonvolatile semiconductor memory device having a split-gate type gate structure according to the present invention.

As shown in FIG. 8, for example, an isolation region 12 made of silicon oxide or the like and an element formation region surrounded by the isolation region 12 are selectively formed in the upper portion of a p-type silicon semiconductor substrate 11. A first insulating film 13 approximately 8 to 11 nm thick, a floating gate electrode 14B made of n-type polysilicon, and a second insulating film 15 approximately 8 to 20 nm thick that covers the top surface and the side surfaces of the floating gate electrode 14B are formed on the element formation region of the semiconductor substrate 11, and a control gate electrode 16C made of n-type polysilicon is formed covering a side surface of the floating gate electrode 14B with the second insulating film 15 between them. Also, an n-type source region 17 is formed in regions of the semiconductor substrate 11 on the side of the floating gate electrode 14B opposite the control gate electrode 16C and an n-type drain region 18 is formed on the side of the control gate electrode 16C.

In Embodiment 2, the gate has a split-gate structure in which the portion of the first insulating film 13 where the floating gate electrode 14B and the semiconductor substrate 11 oppose one another functions as a tunnel film. The first insulating film 13 has been formed at a substantially uniform film thickness without birds beak-shaped film thickening at its side end portions in the gate length direction.

It should be noted that the portion in the second insulating film 15 where the floating gate electrode 14B and the control gate electrode 16C oppose one another functions as a capacitor film. Also, the portion in the first insulating film 13 where the control gate electrode 16C and the semiconductor substrate 11 oppose one another functions as a gate insulating film.

Hereinafter, a method of manufacturing the nonvolatile semiconductor memory device configured as above is described with reference to the drawings.

FIGS. 9A to 9D and FIGS. 10A to 10D show cross-sectional views of the steps and the order of the method of manufacturing the nonvolatile semiconductor memory device according to Embodiment 2 of this invention.

Figure 9A:
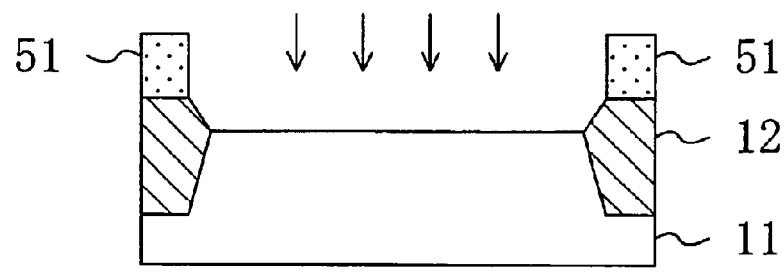
FIGS. 9A to 9D are structural cross-sectional diagrams showing the steps and the order of the method of manufacturing the split-gate type nonvolatile semiconductor memory device according to Embodiment 2 of this invention.

First, as shown in FIG. 9A, the isolation region 12 made of silicon oxide is selectively formed in an upper portion of the p-type silicon semiconductor substrate 11, and then, with a first resist pattern 51 that has an opening at the element formation region serving as a mask, p-type impurity ions are implanted into the semiconductor substrate 11 to form a p-type well region and a p-type channel region.

Figure 9B:
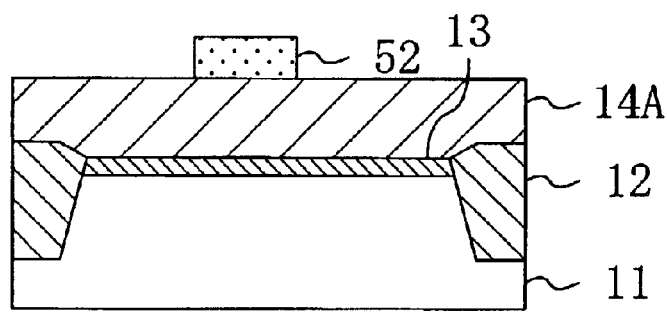

Next, as shown in FIG. 9B, after the first resist pattern 51 has been removed, the first insulating film 13 made of silicon oxide is formed on the element formation region of the semiconductor substrate 11 at a film thickness of approximately 8 to 11 nm through thermal oxidation, for example. A first polysilicon film 14A is then deposited by CVD. Here, the first polysilicon film 14A can be provided with conductivity while adding phosphorus during deposition or can be provided with conductivity by implanting phosphorus ions after deposition. Then, using photolithography, a second resist pattern 52 having a floating gate pattern is formed on the first polysilicon film 14A.

Figure 9C:
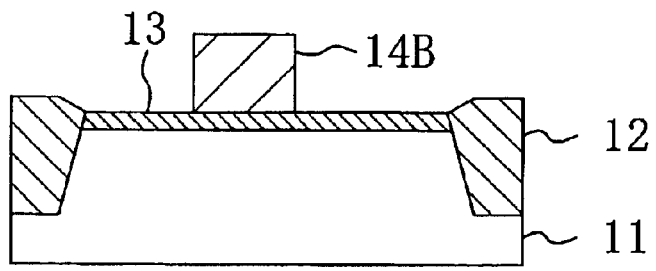

Next, as shown in FIG. 9C, the second resist pattern 52 serves as a mask and the first polysilicon film 14A is etched to form the floating gate electrode 14B from the first polysilicon film 14A. The second resist pattern 52 is then removed.

Figure 9D:
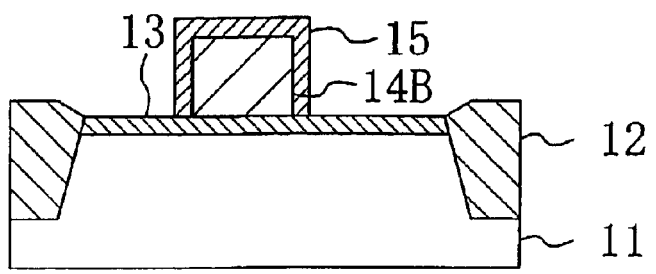

Then, as shown in FIG. 9D, using a rapid thermal oxidation device, the top and side surfaces of the floating gate electrode 14B are oxidized through ISSG, in which oxygen to which about 0.5 to 33% hydrogen has been added is introduced directly into a chamber with a temperature of approximately 900 to 1100° C. and a pressure of approximately 1,000 to 2,000 Pa, in order to generate water vapor from the introduced hydrogen and oxygen onto the heated semiconductor substrate 11. Thus, the second insulating film 15 made of silicon oxide is formed on the surface of the floating gate electrode 14B.

Figure 10A:
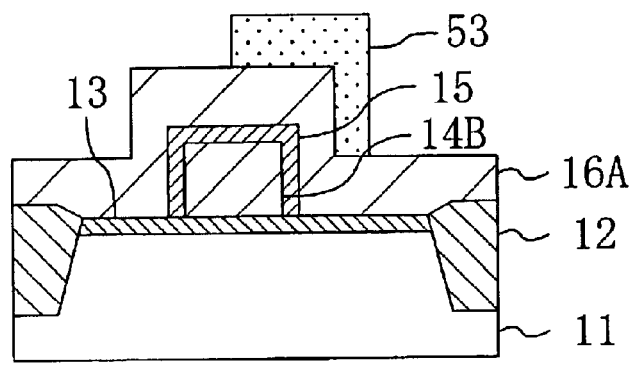
FIGS. 10A to 10D are structural cross-sectional diagrams showing the steps and the order of the method of manufacturing the split-gate type nonvolatile semiconductor memory device according to Embodiment 2 of this invention.

Next, as shown in FIG. 10A, using CVD, a second polysilicon film 16A is deposited on the first insulating film 13 and the second insulating film 15. It should be noted that the second polysilicon film 16A can be provided with conductivity while adding phosphorus during deposition or can be provided with conductivity by implanting phosphorus ions after deposition. Then, using photolithography, a third resist pattern 53 that has a control gate pattern covering the drain-side side surface of the floating gate electrode 14B is formed on the second polysilicon film 16A.

Figure 10B:
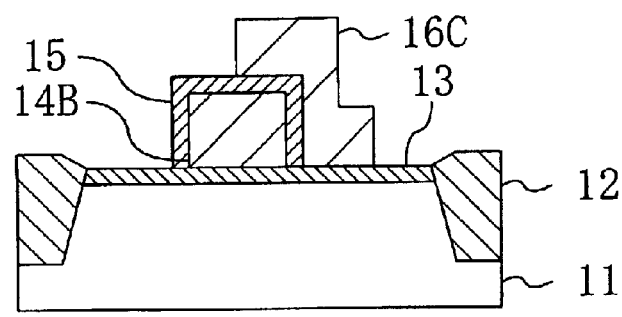

Next, as shown in FIG. 10B, the third resist pattern 53 serves as a mask and the second polysilicon film 16A is etched to form the control gate electrode 16C from the second polysilicon film 16A. The third resist pattern 53 is then removed.

Figure 10C:
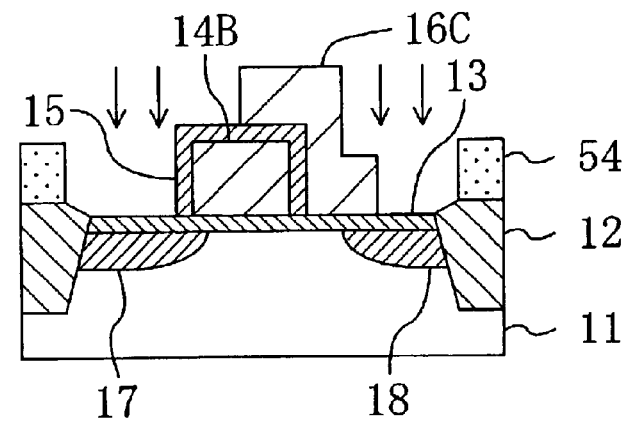

Next, as shown in FIG. 10C, with a fourth resist pattern 54, which has an opening at the element formation region, the control gate electrode 16C and the floating gate electrode 14B serve as masks, ion implantation of phosphorus or arsenic ions is performed with respect to the semiconductor substrate 11 to form the source region 17 in the region on the side of the floating gate electrode 14 that is opposite the side of the control gate electrode 16C in the element formation region and the drain region 18 and the region of the element formation region that is on the side of the control gate electrode 16C.

Figure 10D:
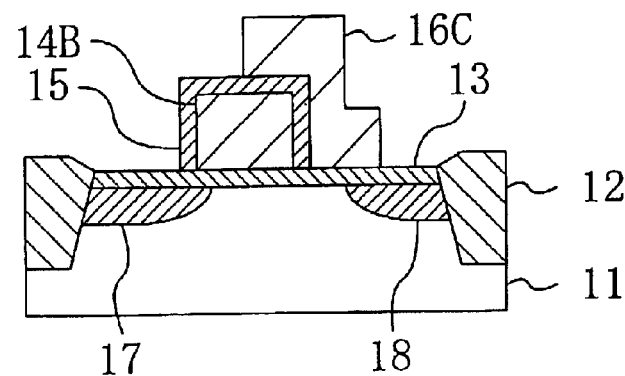

Then, as shown in FIG. 10D, the fourth resist pattern 54 is removed to obtain the nonvolatile semiconductor memory device shown in FIG. 8.

Figure 15:
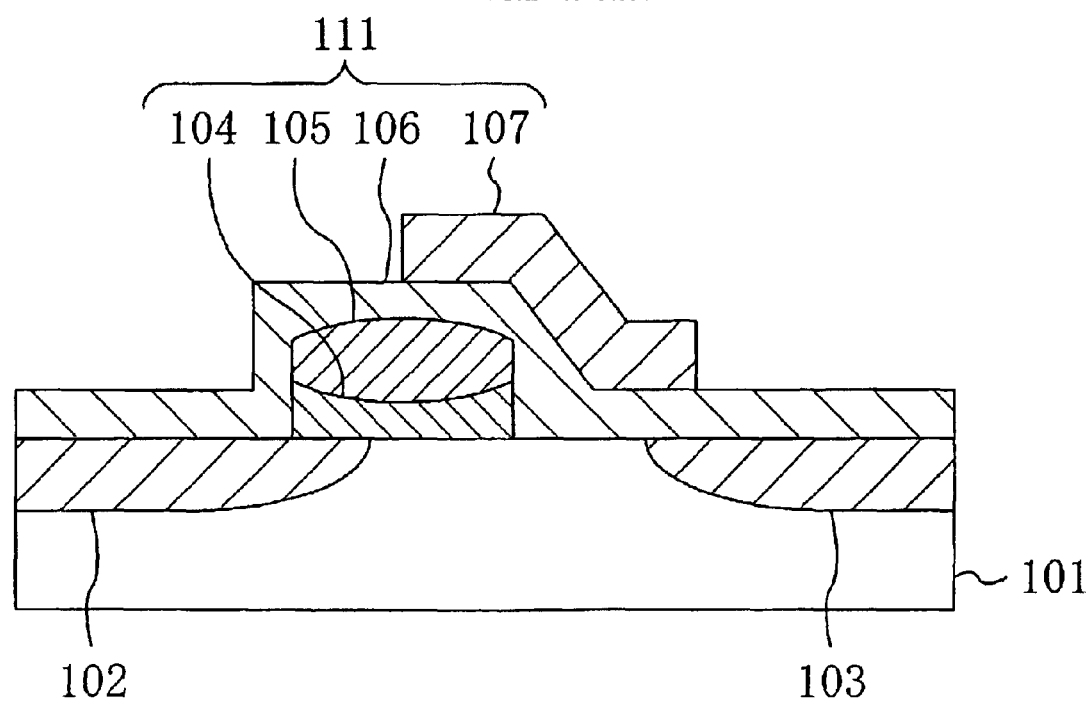
FIG. 15 is a diagram showing the structural cross section of a conventional split-gate type nonvolatile semiconductor memory device.

Thus, with the method of manufacturing the nonvolatile semiconductor memory device according to Embodiment 2, ISSG is employed to form the second insulating film 15 on the surface of the floating gate electrode 14B, so that almost no birds beak like that shown in FIG. 15 caused by ordinary oxidization methods is generated in the portion of the first insulating film 13 that is below the floating gate electrode 14B, and thus the insulating film has a substantially uniform film thickness. As a result, the deterioration of the element's properties as a transistor can be inhibited, and a drop in erase speeds due to a thick first insulating film 13 (tunnel film) can be prevented.

Moreover, with regard to the film thickness of the second insulating film 15 formed on the surface of the polysilicon floating gate electrode 14B through ISSG, the speed at which the film is oxidized is substantially constant independent of the amount of ion implantation with respect to the polysilicon film, which is the underlining layer. Therefore, the film thickness of the second insulating film 15 can be suppressed to about 60 to 80% of the film thickness achieved through conventional oxidation methods, so that the second insulating film 15 can be obtained at a predetermined film thickness. Also, the withstand voltage of the polysilicon oxide film that is formed through ISSG is also increased, and as a result the value of the capacitive coupling ratio between the floating gate electrode 14B and the control gate electrode 16C is increased, so that the element's performance as a memory element is improved.

It should be noted that in Embodiment 2, the control gate electrode 16C covers the top surface and one of the side surfaces of the floating gate electrode 14B, however, this embodiment can also be applied to a method of manufacturing split-gate nonvolatile memory devices of other configurations, such as a configuration in which the floating gate electrode 14B and the control gate electrode 16C are adjacent to one another on the semiconductor substrate 11 with the second insulating film 15 interposed between them.

MODIFIED EXAMPLE OF EMBODIMENT 2

Hereinafter, a nonvolatile semiconductor memory device according to a modified example of Embodiment 2 of this invention is described with reference to the drawings.

Figure 11:
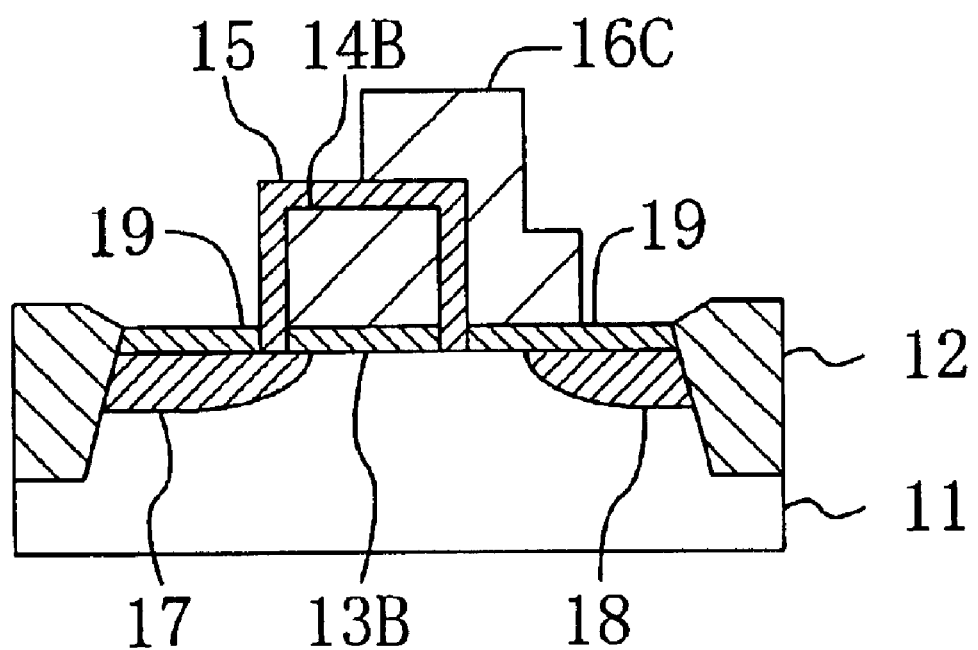
FIG. 11 is diagram showing the structural cross section of a split-gate type nonvolatile semiconductor memory device according to the modified example of Embodiment 2 of the present invention.

FIG. 11 shows a cross section of the structure of the nonvolatile semiconductor memory device according to a modified example of Embodiment 2. Structural members in FIG. 11 that are identical to those shown in FIG. 8 are assigned identical reference numerals and a description thereof is omitted.

As shown in FIG. 11, the nonvolatile semiconductor memory device according to this modified example has a structure in which the first insulating film 13 is formed as the tunnel insulating film 13B and a third insulating film 19 is newly formed on the element formation region.

That is, the third insulating film 19 is formed through the same process as the first insulating film 13 in Embodiment 2, and thus a description thereof is omitted.

Furthermore, as another modification, the third insulating film 19 can also be formed through the same process as the second insulating film 15.

Hereinafter, a method of manufacturing the nonvolatile semiconductor memory device configured as above is described with reference to the drawings.

FIGS. 12A to 12D and FIGS. 13A to 13D show cross-sectional views of the steps and the order of the method of manufacturing the nonvolatile semiconductor memory device according to the modified example of Embodiment 2 of this invention.

Figure 12A:
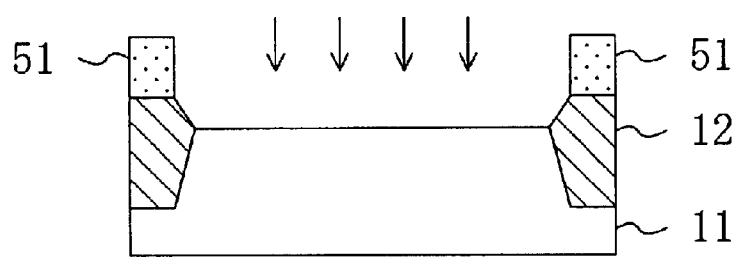
FIGS. 12A to 12D are structural cross-sectional diagrams showing the steps and the order of the method of manufacturing the split-gate type nonvolatile semiconductor memory device according to the modified example of Embodiment 2 of this invention.

First, as shown in FIG. 12A, the isolation region 12 made of silicon oxide is selectively formed in an upper portion of the p-type silicon semiconductor substrate 11, and then, with a first resist pattern 51 that has an opening at the element formation region serving as a mask, p-type impurity ions are ion implanted into the semiconductor substrate 11 to form a p-type well region and a p-type channel region.

Figure 12B:
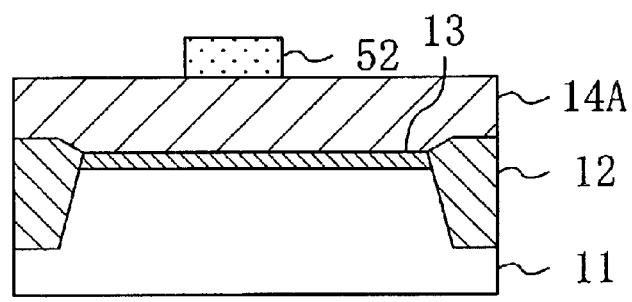

Next, as shown in FIG. 12B, after the first resist pattern 51 has been removed, the first insulating film 13 made of silicon oxide is formed on the element formation region of the semiconductor substrate 11 at a film thickness of approximately 8 to 11 nm by thermal oxidation, for example. The first polysilicon film 14A is then deposited by CVD. Here, the first polysilicon film 14A can be provided with n-type conductivity during or after deposition. Then, using photolithography, a second resist pattern 52 having a floating gate pattern is formed on the first polysilicon film 14A.

Figure 12C:
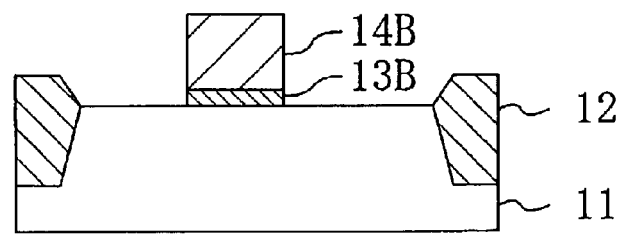

Then, as shown in FIG. 12C, the second resist pattern 52 serves as a mask and the first polysilicon film 14A and the first insulating film 13 are sequentially etched to form the floating gate electrode 14B from the first polysilicon film 14A and then form the tunnel insulating film 13B from the first insulating film 13. The second resist pattern 52 is then removed.

Figure 12D:
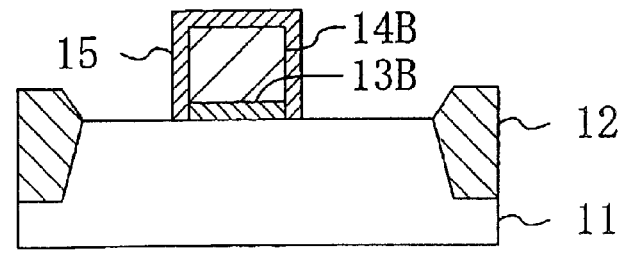

Then, as shown in FIG. 12D, using a rapid thermal oxidation device, a second insulating film 15 made of silicon oxide is formed on the top and side surfaces of the floating gate electrode 14B through ISSG, in which oxygen to which about 0.5 to 33% hydrogen has been added is introduced directly into a chamber with a temperature of approximately 900 to 1100° C. and a pressure of approximately 1,000 to 2,000 Pa, in order to generate water vapor onto the heated semiconductor substrate 11 from the introduced hydrogen and oxygen.

Figure 13A:
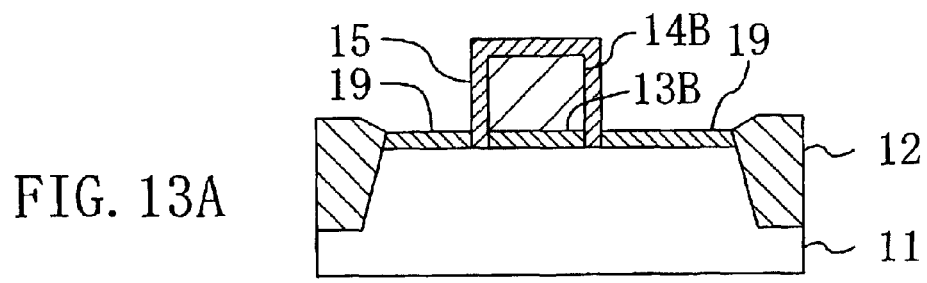
FIGS. 13A to 13D are structural cross-sectional diagrams showing the steps and the order of the method of manufacturing the split-gate type nonvolatile semiconductor memory device according to the modified example of Embodiment 2 of this invention.

Next, as shown in FIG. 13A, the third insulating film 19 made of silicon oxide is formed on the element formation region of the semiconductor substrate 11 to a film thickness of approximately 8 to 11 nm through an ordinary thermal oxidation method.

Figure 13B:
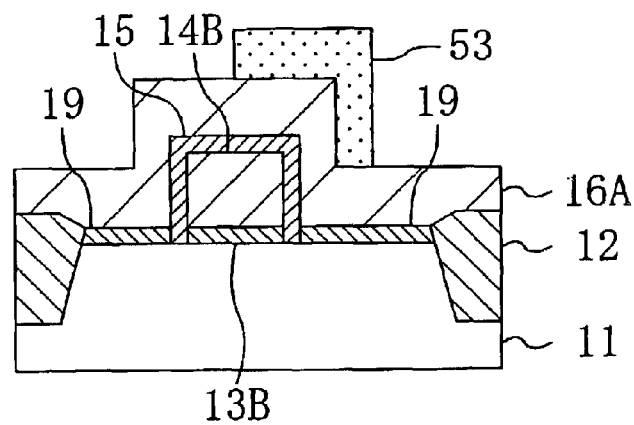

Then, as shown in FIG. 13B, the second polysilicon film 16A is deposited on the third insulating film 19 and the second insulating film 15 through CVD. It should be noted that the second polysilicon film 16A can be provided with conductivity while adding phosphorus during deposition or can be provided with conductivity by implanting phosphorus ions after deposition. Then, using photolithography, a third resist pattern 53 that has a control gate pattern covering the drain-side side surface of the floating gate electrode 14B is formed on the second polysilicon film 16A.

Figure 13C:
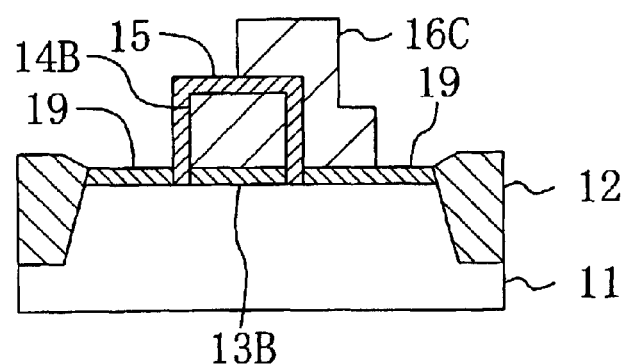

Next, as shown in FIG. 13C, the third resist pattern 53 serves as a mask and the second polysilicon film 16A is etched to form the control gate electrode 16B from the second polysilicon film 16A. Here, the portion of the second insulating film 15 where the floating gate electrode 14B and the control gate electrode 16B oppose one another functions as a capacitor film. Also, the portion in the third insulating film 19 where the control gate electrode 16C and the semiconductor substrate 11 are in opposition functions as a gate insulating film. The third resist pattern 53 is then removed.

Figure 13D:
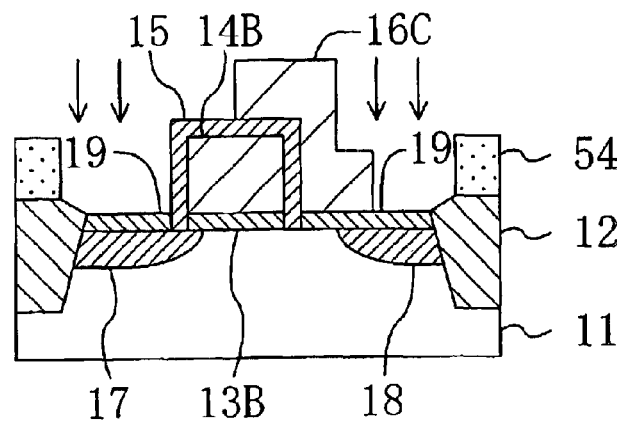

Next, as shown in FIG. 13D, with a fourth resist pattern 54, which has an opening at the element formation region, the control gate electrode 16B and the floating gate electrode 14B serving as masks, phosphorus or arsenic ions are ion implanted in the semiconductor substrate 11 to form, in the element formation region, the source region 17 in the region on the side of the floating gate electrode 14 that is opposite the side of the control gate electrode 16C and the drain region 18 and in the region that is on the side of the control gate electrode 16C.

Then, the fourth resist pattern 54 is removed to obtain the nonvolatile semiconductor memory device shown in FIG. 11.

Accordingly, this modified example differs from Embodiment 2 in that the first insulating film 13 is patterned in the same shape as the floating gate electrode 14B, and moreover in that the third insulating film 19, which serves as the gate insulating film for the control gate electrode 16C, is formed through a separate process step.

Consequently, as in Embodiment 2, the second insulating film 15 is formed on the surface of the floating gate electrode 14B through ISSG, in which water vapor is generated on the semiconductor substrate 11 from the hydrogen and the oxygen that are introduced into the chamber, and thus almost no birds beak is generated in the side portions of the tunnel insulating film 13B.

Moreover, the film thickness of the second insulating film 15 formed by ISSG on the surface of the polysilicon floating gate electrode 14B can be inhibited to about 60 to 80% of the film thickness obtained through conventional oxidation methods, so that the second insulating film 15 can be obtained at a predetermined film thickness.

Thus, the erase speed during the erase operation does not drop, and the value of the capacitive coupling ratio between the floating gate electrode 14B and the control gate electrode 16C is increased, so that low-voltage operation and high-speed operation are possible.

It should be noted that in this modified example as well, the control gate electrode 16C covers the top surface and one of the side surfaces of the floating gate electrode 14B, however, the floating gate electrode 14B and the control gate electrode 16C can also be adjacent to one another on the semiconductor substrate 11 with the second insulating film 15 interposed between them.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a nonvolatile semiconductor memory device, comprising:
   a first step of forming a floating gate electrode from a first conducting film by patterning the first conducting film after a first insulating film and the first conducting film have been formed on a semiconductor substrate;
   a second step of forming a second insulating film directly on an upper portion and side portions of the floating gate electrode by introducing hydrogen and oxygen above the heated semiconductor substrate and generating water vapor on the semiconductor substrate from the introduced hydrogen and oxygen;
   a third step of forming a second conducting film directly on the second insulating film; and
   a fourth step of forming a control gate electrode made of the second conducting film on the floating gate electrode with the second insulating film interposed between them.

2. The method of manufacturing a nonvolatile semiconductor memory device according to claim 1, wherein the first step includes a step of removing the first insulating film with the floating gate electrode serving as a mask, and
   wherein in the second step, the second insulating film is also formed on an upper portion of the semiconductor substrate.

3. The method of manufacturing a nonvolatile semiconductor memory device according to claim 1, wherein the third step includes:
   a step of depositing the second conducting film over the entire surface of the semiconductor substrate, including the floating gate electrode; and
   wherein the fourth step includes: a step of patterning the deposited second conducting film such that the control gate electrode is positioned only above the floating gate electrode.

4. The method of manufacturing a nonvolatile semiconductor memory device according to claim 1, wherein the third step includes:
   a step of depositing the second conducting film over the entire surface of the semiconductor substrate, including the floating gate electrode; and
   wherein the fourth step includes: a step of patterning the deposited second conducting film such that the control gate electrode covers a top surface and a side surface of the floating gate electrode.

* * * * *